United States Patent
Kim et al.

(10) Patent No.: US 9,564,324 B2
(45) Date of Patent: Feb. 7, 2017

(54) METHODS OF FORMING A PATTERN AND DEVICES FORMED BY THE SAME

(71) Applicants: Eunsung Kim, Seoul (KR); Jaewoo Nam, Anyang-si (KR); Chulho Shin, Yongin-si (KR)

(72) Inventors: Eunsung Kim, Seoul (KR); Jaewoo Nam, Anyang-si (KR); Chulho Shin, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 198 days.

(21) Appl. No.: 14/220,440

(22) Filed: Mar. 20, 2014

(65) Prior Publication Data

US 2014/0370712 A1 Dec. 18, 2014

(30) Foreign Application Priority Data

Jun. 12, 2013 (KR) .................. 10-2013-0067223

(51) Int. Cl.
| | | |
|---|---|---|
| *H01L 21/00* | (2006.01) | |
| *H01L 21/027* | (2006.01) | |
| *H01L 29/66* | (2006.01) | |
| *H01L 27/108* | (2006.01) | |
| *H01L 27/115* | (2006.01) | |

(52) U.S. Cl.
CPC ..... *H01L 21/0271* (2013.01); *H01L 29/66795* (2013.01); *H01L 27/10855* (2013.01); *H01L 27/11582* (2013.01)

(58) Field of Classification Search
CPC .................. H01L 21/0271; H01L 29/66795
See application file for complete search history.

(56) References Cited

U.S. PATENT DOCUMENTS

| | | | |
|---|---|---|---|
| 7,923,373 B2 | 4/2011 | Sandhu | |
| 8,226,838 B2 | 7/2012 | Cheng et al. | |
| 8,273,886 B2 | 9/2012 | Afzali-Ardakani et al. | |
| 8,309,278 B2 | 11/2012 | Yang et al. | |
| 8,336,003 B2 | 12/2012 | Cheng et al. | |
| 2008/0299774 A1* | 12/2008 | Sandhu .............. | H01L 21/0337 438/696 |
| 2008/0318157 A1 | 12/2008 | Afzali-Ardankani et al. | |
| 2009/0179002 A1 | 7/2009 | Cheng et al. | |
| 2009/0191713 A1 | 7/2009 | Yoon et al. | |
| 2011/0200795 A1* | 8/2011 | Lammers .............. | B82Y 10/00 428/195.1 |

(Continued)

FOREIGN PATENT DOCUMENTS

| | | |
|---|---|---|
| JP | 2011018778 A | 1/2011 |
| JP | 4673266 B2 | 4/2011 |

(Continued)

*Primary Examiner* — Whitney T Moore
*Assistant Examiner* — Joseph Galvin, III
(74) *Attorney, Agent, or Firm* — Harness, Dickey & Pierce, P.L.C.

(57) ABSTRACT

The inventive concepts provide methods of forming a pattern. In the method, a block copolymer layer may be formed on a neutral layer having an uneven structure and then phase separation is induced. The neutral layer may have an affinity for all of a hydrophilic polymer and a hydrophobic polymer, so that vertical cultivation of phases of the block copolymer may be realized on the uneven structure. Thus, a self-assembled phenomenon may be induced.

28 Claims, 22 Drawing Sheets

(56) References Cited

U.S. PATENT DOCUMENTS

| | | | |
|---|---|---|---|
| 2011/0209106 A1 | 8/2011 | Cheng et al. | |
| 2012/0009390 A1 | 1/2012 | Yang et al. | |
| 2012/0196094 A1* | 8/2012 | Xu | G11B 5/746 428/195.1 |
| 2014/0273511 A1* | 9/2014 | Farrell | H01L 21/0337 438/763 |
| 2015/0132964 A1* | 5/2015 | Kobayashi | H01L 21/02118 438/703 |

FOREIGN PATENT DOCUMENTS

| | | |
|---|---|---|
| KR | 20120126442 A | 11/2012 |
| KR | 20130009448 A | 1/2013 |

* cited by examiner (a) Diblock copolymer (b) Triblock copolymer

Homogeneous

METHODS OF FORMING A PATTERN AND DEVICES FORMED BY THE SAME

CROSS-REFERENCE TO RELATED APPLICATION

This U.S. non-provisional patent application claims priority under 35 U.S.C. §119 to Korean Patent Application No. 10-2013-0067223, filed on Jun. 12, 2013 in the Korean Intellectual Property Office, the disclosure of which is hereby incorporated by reference in its entirety.

BACKGROUND

1. Field

The inventive concepts relate to a method of forming a semiconductor device and, more particularly, to methods of forming a pattern and devices formed by the same.

2. Description of Related Art

As semiconductor devices are being increasingly integrated, finer patterning processes are demanded. A width of a photoresist pattern realized by an exposure process is determined depending on the following Rayleigh's equation.

[Rayleigh's Equation]

$$R = k1 \times \lambda / NA$$

In Rayleigh's equation, "R" denotes a resolution, "k1" is a process constant, "λ" denotes a wavelength of a light source, and "NA (numerical aperture)" denotes an effective aperture of a lens. Thus, in order to lower the resolution R, the process constant k1 may be reduced, the wavelength λ of the light source may be reduced, and/or the effective aperture NA of the lens may be increased. Exposure processes using extreme ultraviolet (EUV) having a wavelength of 13.4 nm as a light source are demanded in order to lower the wavelength of the light source than a wavelength (248 nm) of currently used KrF or a wavelength (193 nm) of currently used ArF. However, exposure processes using the EUV need environments (e.g., a vacuum state and reflective photomasks, etc.) different from those of conventional exposure processes, and exposure apparatuses using the EUV as a light source are relatively expensive. Thus, it is relatively difficult to apply the exposure processes using the EUV to manufacturing processes of semiconductor devices.

As described above, there are limitations in reducing the wavelength of the light source. Research has been conducted for increasing the effective aperture NA of the lens in order to lower the resolution R. The effective aperture NA is proportional to n×sin θ where "n" denotes a refractive index of a medium between the lens and a photoresist. Thus, if the refractive index of the medium is high, the resolution may be lowered. An immersion lithography process using this principle has been proposed. The immersion lithography process uses a conventional light source and is performed in a medium having a greater refractive index than air in order to improve a resolution characteristic. For example, water having a refractive index of 1.44 greater than air having a refractive index of 1 is used as the medium.

SUMMARY

Example embodiments of the inventive concepts may provide methods of forming a pattern capable of overcoming limitations of an exposure process.

In at least one non-limiting embodiment, a method of forming a pattern may include forming a neutral layer having an uneven structure; coating a block copolymer layer on the neutral layer; phase-separating the block copolymer layer to form a plurality of first patterns spaced apart from each other and a second pattern filling a space between the first patterns; removing the first patterns or the second pattern; and performing an etching process using a not-removed pattern of the first patterns and/or the second pattern as an etch mask.

In some embodiments, forming the neutral layer having the uneven structure may include forming a lower structure having an uneven structure on the substrate; and conformally forming the neutral layer covering a surface of the lower structure.

In some embodiments, the neutral layer may be conformally formed by a coating process.

In some embodiments, the first patterns and the second pattern may have different properties from each other.

In some embodiments, the first patterns may have a hydrophilic property, and the second pattern may have a hydrophobic property.

In some embodiments, the first patterns may be removed. Removing the first patterns may include irradiating the first patterns with deep ultraviolet rays; and performing a wet etching process to remove the first patterns.

In some embodiments, the uneven structure may include a plurality of holes or grooves.

In some embodiments, a single first pattern may be formed in each of the holes or each of the grooves.

In some embodiments, the first patterns may be formed to have a cylinder-shape or a line-shape.

In some embodiments, a sum of a width of one of the first patterns and a distance between two first patterns adjacent to each other may be in the range of about 20 nm to about 50 nm.

In some embodiments, the neutral layer may include a polymer brush or a random copolymer.

In some embodiments, forming the neutral layer having the uneven structure may include forming a neutral layer having a flat top surface on the substrate; and removing a portion of the neutral layer by an etching process, thereby forming the uneven structure in an upper portion of the neutral layer.

In at least another non-limiting embodiment, a method of forming a pattern may include forming a lower structure having an uneven structure on a substrate; conformally forming a neutral layer covering a surface of the lower structure; coating a block copolymer layer on the neutral layer; phase-separating the block copolymer layer to form first patterns spaced apart from each other and a second pattern filling a space between the first patterns; removing the first patterns or the second pattern; and performing an etching process with respect to the lower structure using a not-removed pattern of the first patterns and/or the second pattern as an etch mask.

In at least another non-limiting embodiment, a fin field effect transistor device may include a plurality of active fins protruding from a substrate, the active fins having line-shapes parallel to each other; a gate electrode crossing over the active fins; a gate insulating layer disposed between the gate electrode and the active fins; and source/drain regions disposed in the active fins at both sides of the gate electrode. A sum of a width of one of the active fins and a distance between two active fins adjacent to each other may be in the range of about 20 nm to about 40 nm.

In at least another non-limiting embodiment, a dynamic random access memory (DRAM) device may include a plurality of lower electrodes having cylinder or cup shapes on a substrate. The lower electrodes may include one lower electrode disposed at a center of a hexagon and six lower electrodes respectively disposed at vertices of the hexagon. A sum of a diameter of one of the lower electrodes and a distance between two lower electrode adjacent to each other may be in the range of about 30 nm to about 50 nm.

In at least another non-limiting embodiment, a method of forming a pattern may include coating a neutral layer with a block copolymer layer, the neutral layer having an uneven surface; phase-separating the block copolymer layer to form a plurality of first patterns within a second pattern; removing the plurality of first patterns or the second pattern to obtain a remaining pattern; and performing an etching process using the remaining pattern as an etch mask.

BRIEF DESCRIPTION OF THE DRAWINGS

The inventive concepts will become more apparent in view of the attached drawings and accompanying detailed description.

FIGS. 4A to 9A are plan views illustrating a method of forming a pattern according to some non-limiting embodiments of the inventive concepts;

FIGS. 4B to 9B are cross-sectional views taken along lines C-C of FIGS. 4A to 9A, respectively;

DETAILED DESCRIPTION OF EXAMPLE EMBODIMENTS

Figure 1A:
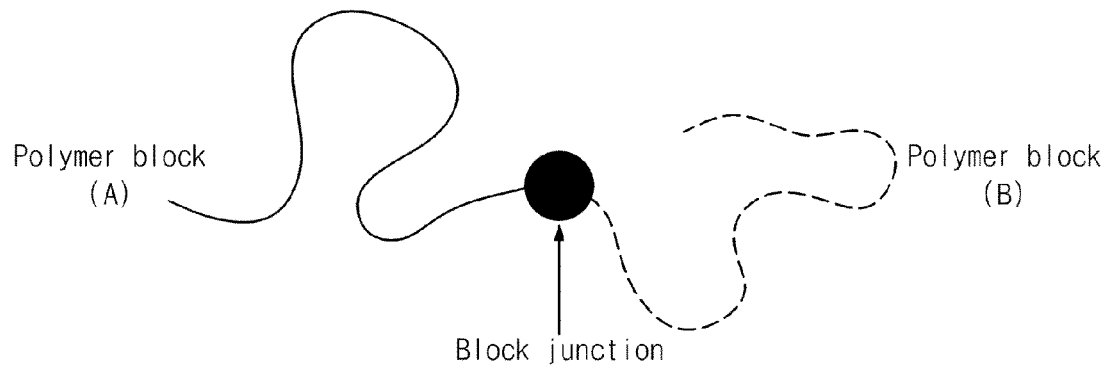
FIGS. 1A and 1B broadly illustrate block copolymers.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and may have been exaggerated for clarity.

The terminology used herein is for the purpose of describing particular embodiments only and is not intended to limit the present disclosure. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas shown in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure. Example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
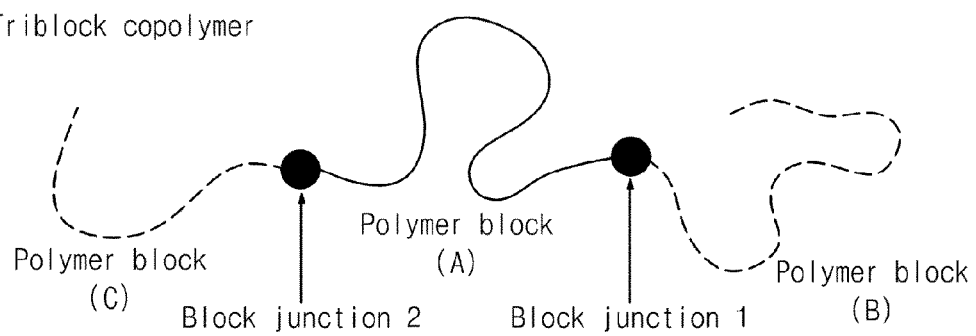

FIGS. 1A and 1B broadly illustrate block copolymers.

Referring to FIGS. 1A and 1B, a block copolymer includes two or more polymer blocks of which ends are combined with each other by a covalent bond. The two or more polymer blocks have properties different from each other. A diblock copolymer corresponding to an example of the block copolymer includes a polymer block A and a polymer block B. First ends of the polymer block A and the polymer block B are combined with each other by the covalent bond to form a block junction. Second ends of the polymer blocks A and B that are not connected to each other by the covalent bond may repel each other. For example, one of the polymer blocks A and B may have hydrophilic property and the other of the polymer blocks A and B may have hydrophobic property. The hydrophilic polymer block may have polarity. A triblock copolymer corresponding to another example of the block copolymer includes three polymer blocks A, B, and C. The three polymer blocks A, B, and C may be combined with each other by the covalent bonds to generate two block junctions (i.e., a first block junction and a second block junction). For example, the polymer block B and the polymer block C are respectively bonded to both ends of the polymer block A by the covalent bonds. Thus, the first block junction may be formed between the polymer blocks A and B and the second block junction may be formed between the polymer blocks A and C. At this time, the polymer block A may have a property different from those of the polymer blocks B and C combined with the both ends of the polymer block A. The polymer block B and the polymer block C may have the same property. For example, the polymer blocks B and C may be the same polymer.

Figure 2A:
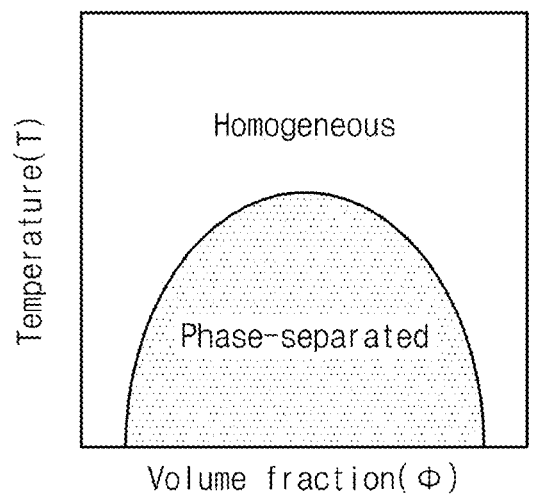
FIGS. 2A, 2B, and 2C are constitutional diagrams illustrating a state of a block copolymer according to a volume fraction and a temperature.
Figure 2B:
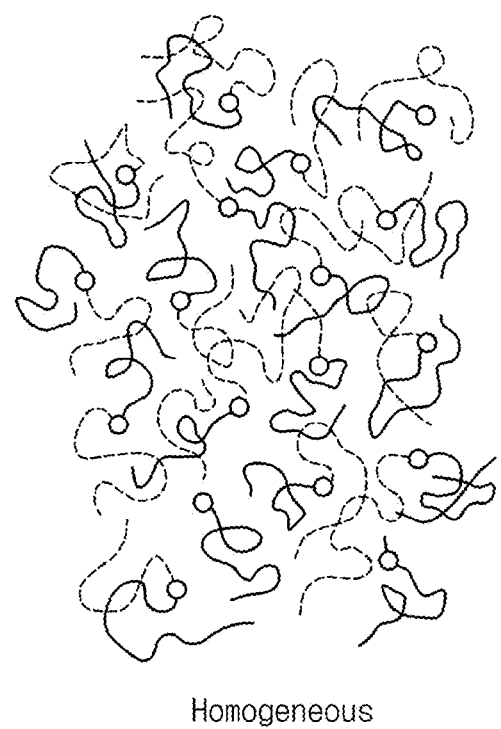
Figure 2C:
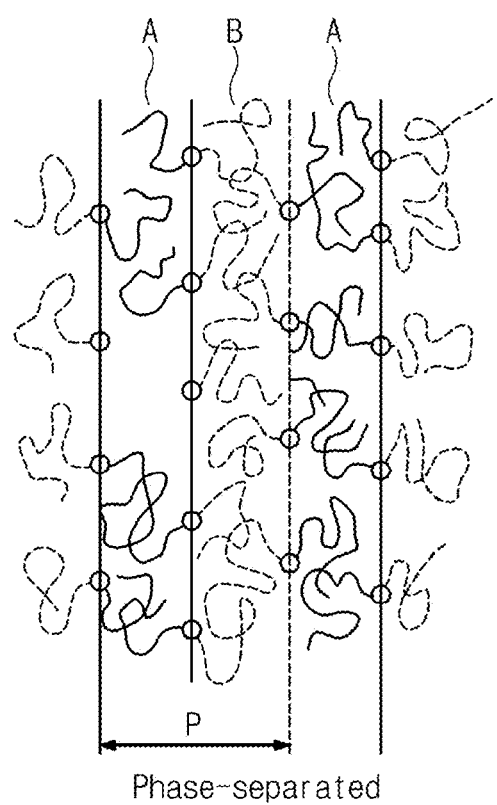

FIGS. 2A, 2B, and 2C are constitutional diagrams illustrating a state of a block copolymer according to a volume fraction and a temperature.

Referring to FIGS. 2A, 2B, and 2C, if a temperature T is lowered at a specific volume fraction ($\phi$), a state of the diblock copolymer may be changed from a homogeneous state into a micro-phase separation state. In the homogeneous state, a first polymer block A and a second polymer block B of the block copolymer are disposed randomly. In the micro-phase separation state, the first polymer block A and the second polymer block B are self-assembled to be divided into different domains from each other. Pitches between first polymer block domains A are regular in the micro-phase separation state. In other words, widths of the first polymer block domains A are regular, and widths of the second polymer block domains B are regular. At this time, the widths of the polymer block domains A and B may be determined depending on molecular weights of the polymer blocks.

Figure 3:
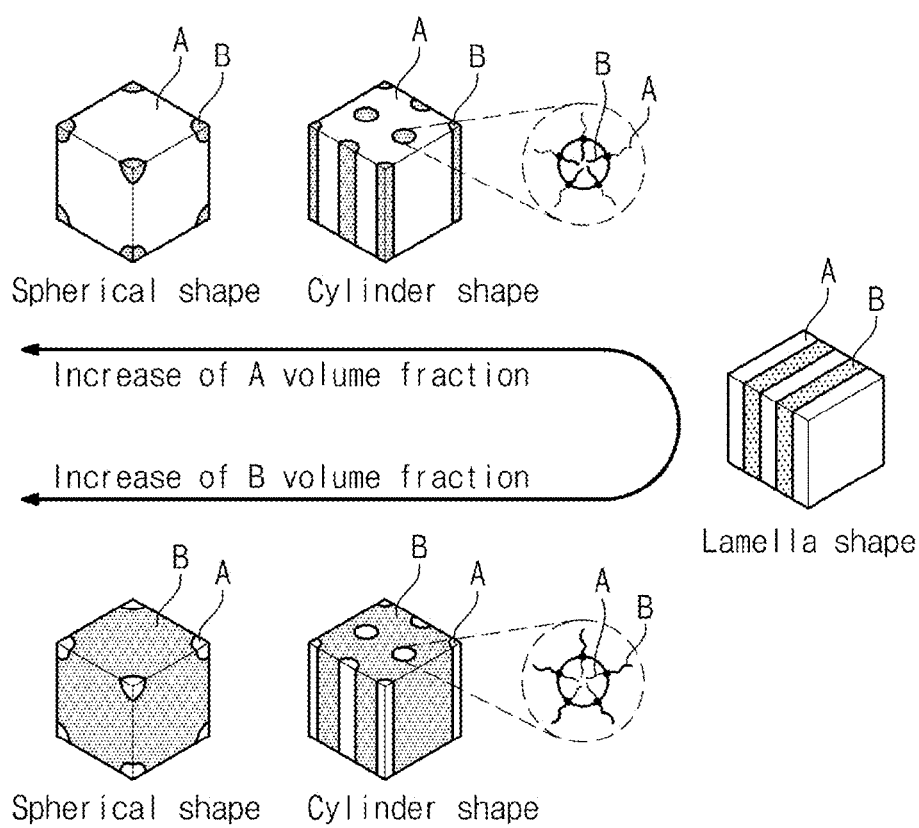
FIG. 3 illustrates changes of a shape of a polymer block domain according to a volume fraction.

Referring to FIG. 3, a shape of the polymer block domain is changed depending on the volume fraction ($\phi$). In more detail, if the first polymer block A and the second polymer block B have similar volume fractions to each other, the first polymer block domain A and the second polymer block domain B are sequentially stacked to form a lamellar domain having a lamellar structure. If the volume fraction of the second polymer block B is increased, the first polymer block A is formed into an array including regularly arranged cylindrical domains and the second polymer block B is formed into a polymer matrix surrounding the cylindrical domains. Additionally, if the volume fraction of the second polymer block B is further increased, the first polymer block A is formed into an array including regularly arranged spherical domains and the second polymer block B is formed into a polymer matrix surrounding the spherical domains. A phenomenon opposite to the phenomenon described above arises when the volume fraction of the first polymer block A is increased.

In example embodiments of the inventive concepts, a pattern having a width smaller than a minimum width realized by a photolithography process may be formed using the property of the block copolymer that forms the cylindrical domain array.

FIGS. 4A to 9A are plan views illustrating a method of forming a pattern according to some non-limiting embodiments of the inventive concepts. FIGS. 4B to 9B are cross-sectional views taken along lines C-C of FIGS. 4A to 9A, respectively. FIG. 7C is an enlarged view of a portion 'P1' of FIG. 7B.

Figure 4A:
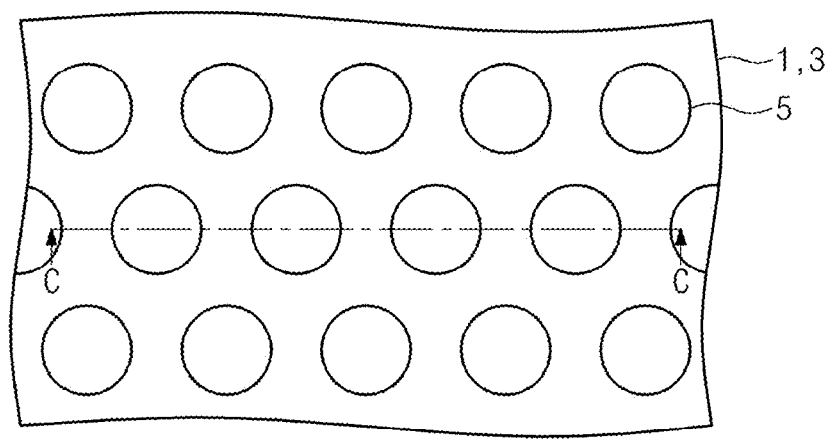
Figure 4B:
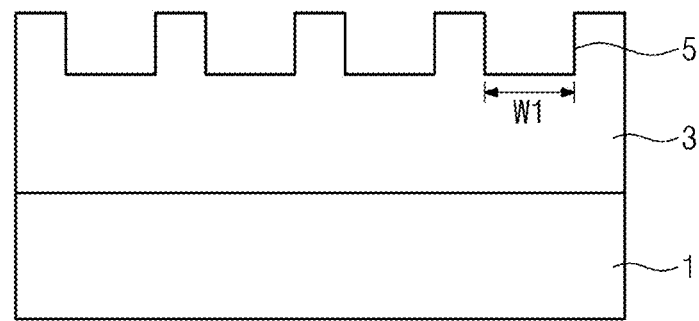

Referring to FIGS. 4A and 4B, a lower structure 3 including a plurality of first holes 5 is formed on a substrate 1. The lower structure 3 may be a single-layered or multi-layered insulating layer and may include a conductive layer disposed within the lower structure 3. The lower structure 3 may be formed by a deposition process and an etching process. The first holes 5 may be formed to have a first width W1.

Figure 5A:
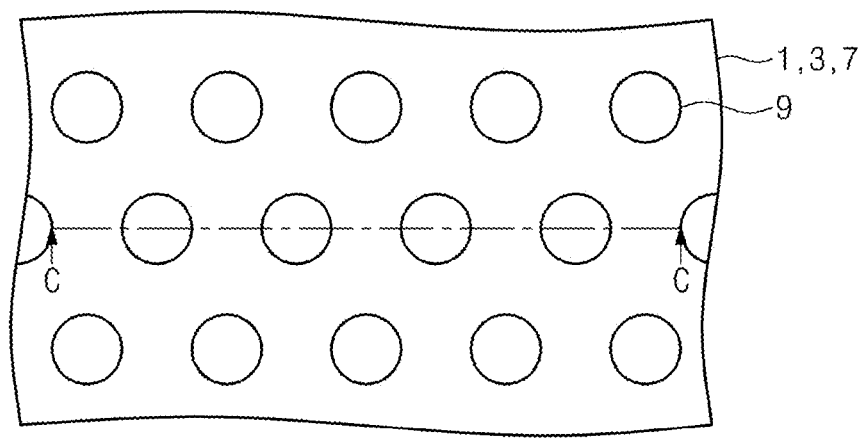
Figure 5B:
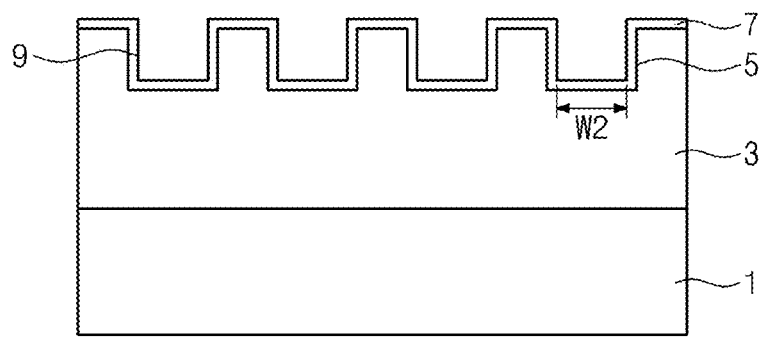

Referring to FIGS. 5A and 5B, a neutral layer 7 may be conformally formed on an entire surface of the substrate 1 having the lower structure 3. In other words, a thickness of the neutral layer 7 may be substantially uniform on bottom surfaces and sidewalls of the first holes 5 and a top surface of the lower structure 3. The neutral layer 7 may be formed by a coating method. Since the neutral layer 7 is conformally formed on the lower structure 3 having an uneven structure, a top surface of the neutral layer 7 may have an uneven structure. In other words, a plurality of second holes 9 overlapping with the first holes 5 may be formed on the neutral layer 7. A width W2 of the second holes 9 is reduced by the thickness of the neutral layer 7, so that the width W2 of the second hole 9 is less than the width W1 of the first hole 5. An affinity of the neutral layer 7 for a hydrophilic polymer may be substantially equal to an affinity of the neutral layer 7 for a hydrophobic polymer. The neutral layer 7 may be formed of a material capable of making a contact angle of about 75 degrees to about 80 degrees with a solution including a block copolymer used in a subsequent process. For example, the neutral layer 7 may be a self-assembled monolayer (SAM), a polymer brush, a cross-linked random copolymer mat.

The self-assembled monolayer may be selected from a group including phenethyltrichlorosilane (PETCS), phenyltrichlorosilane (PTCS), benzyltrichlorosilane (BZTCS), tolyltrichlorosilane (TTCS), 2-[(trimethoxysilyl)ethyl]-2-pyridine (PYRTMS), 4-biphenylyltrimethoxysilane (BPTMS), octadecyltrichlorosilane (OTS), 1-naphthyltrimethoxysilane (NAPTMS), 1-[(trimethoxysilyl)methyl] naphthalene (MNATMS), and (9-methylanthracenyl) trimethoxysilane (MANTMS).

The polymer brush may have a randomly combined shape of a hydrophilic polymer and a hydrophobic polymer. The polymer brush may be defined as a brush type random copolymer. For example, the polymer brush may be polystyrene-random-polymethylmethacrylate (PS-r-PMMA).

The cross-linked random copolymer mat may be benzocyclobutene-functionalized polystyrene-r-poly(methacrylate) copolymer.

Figure 6A:
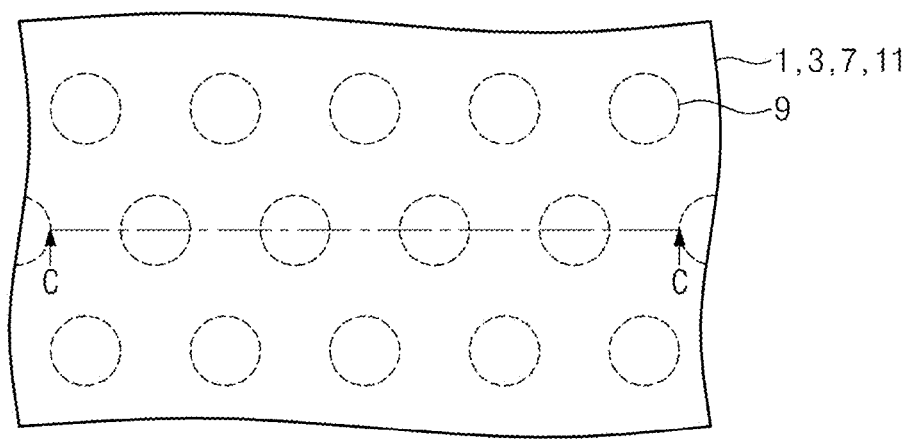
Figure 6B:
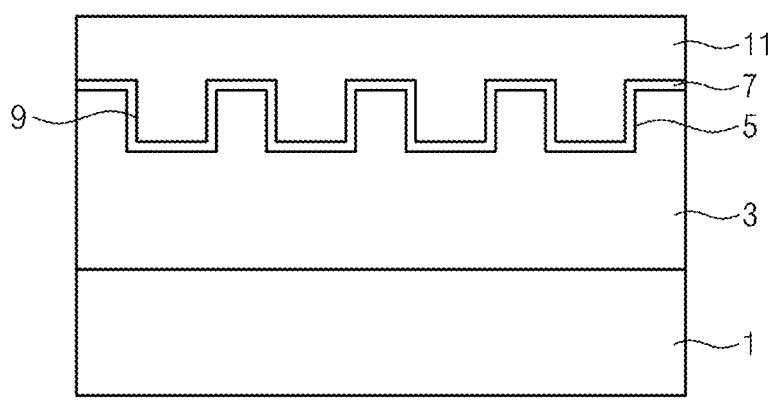

Referring to FIGS. 6A and 6B, a block copolymer layer 11 is coated on the neutral layer 7. A block copolymer included in the block copolymer layer 11 may include a hydrophilic polymer and a hydrophobic polymer which are combined with each other in block form.

The block copolymer may include at least one selected from a group consisting of polystyrene-block-polymethylmethacrylate (PS-b-PMMA), polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene. After the selected block copolymer is dissolved in a solvent, the block copolymer layer 11 may be formed by a spin coating process using the solvent in which the selected block copolymer is dissolved. For example, the solvent may be toluene. The solvent may mostly evaporate after the coating process.

In particular, the block copolymer may be polystyrene-block-polymethylmethacrylate (PS-b-PMMA). In the present embodiment, the polystyrene (PS) with a volumetric ratio of about 70% and the polymethylmethacrylate (PMMA) with a volumetric ratio of about 30% may be added to form the block copolymer, although example embodiments are not limited thereto.

Figure 7A:
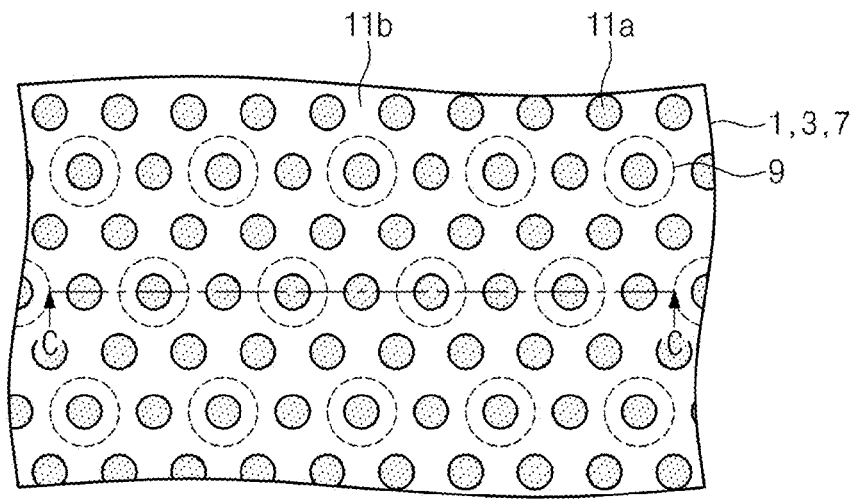
Figure 7B:
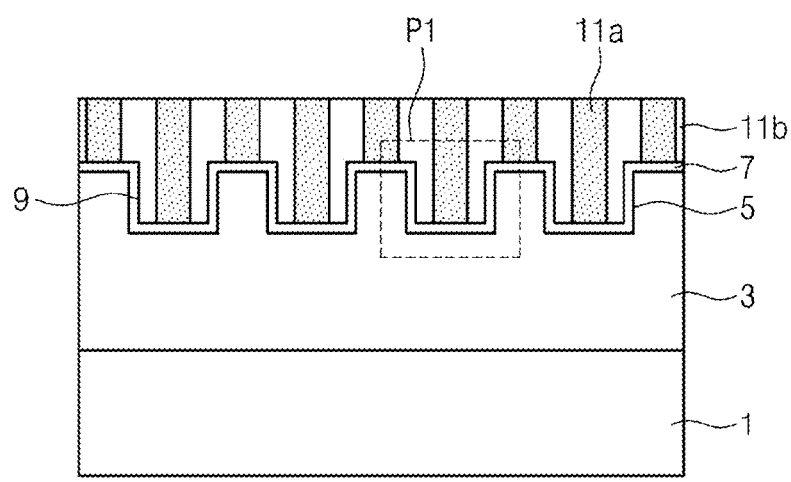
Figure 7C:
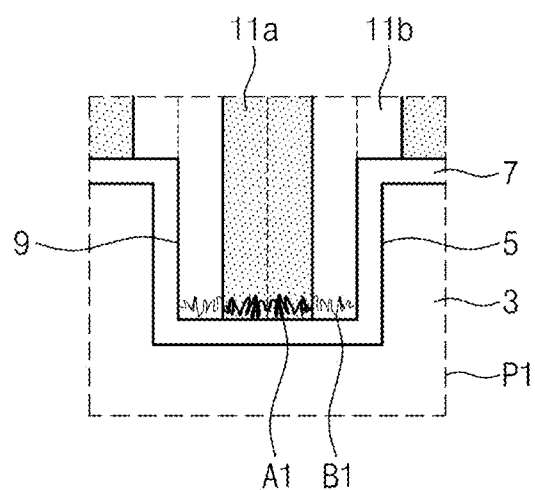
FIG. 7C is an enlarged view of a portion 'P1' of FIG. 7B.

Referring to FIGS. 7A, 7B, and 7C, an annealing process is performed by irradiating ultraviolet rays or by applying heat. The annealing process may be performed at a temperature equal to or greater than a glass transition temperature (Tg) of the block copolymer. By the annealing process, a micro-phase separation phenomenon occurs in the block copolymer layer 11 and first patterns 11a and a second pattern 11b are formed on the neutral layer 7. The first patterns 11a may be formed to have cylinder-shapes. Alternatively, the first patterns 11a may have a lamella shape, as shown in FIG. 3. The second pattern 11b may fill a space between the first patterns 11a. The first pattern 11a and the second pattern 11b may have different properties from each other. For example, the first pattern 11a may have hydrophilic property, and the second pattern 11b may have hydrophobic property. In some non-limiting embodiments, the first patterns 11a may be formed of polymethylmethacrylate (PMMA), and the second pattern 11b may be formed of polystyrene (PS).

A surface of the neutral layer 7 at a bottom of the second hole 9 has the affinity for all of a hydrophilic polymer A1 and a hydrophobic polymer B1. Thus, the surface of the neutral layer 7 may be in contact with both the hydrophilic polymer A1 and the hydrophobic polymer B1 at the bottom of the second hole 9. By this property, the first pattern 11a having the cylinder-shape and the second pattern 11b surrounding the first pattern 11a may be formed in the second hole 9. In this case, a size of the second hole 9 is controlled, so that one first pattern 11a is formed in the second hole 9. The first pattern 11a may be disposed at a center of the second hole 9. In the present embodiment, one first pattern 11a may be disposed on the neutral layer 7 between two second holes 9, although example embodiments are not limited thereto. Distances between the first patterns 11a may be equal to each other. Additionally, the distance between the first patterns 11a may be equal to a diameter of the first pattern 11a. The width W2 of the second hole 9 may be greater than the diameter of the first pattern 11a and be less than three times the diameter of the first pattern 11a. The width W2 and positions of the second holes 9 may be controlled to form the first patterns 11a at desired positions. As molecular weights of the hydrophilic polymer and the hydrophobic polymer constituting the block copolymer are increased, sizes the first and second patterns 11a and 11b may be increased and the width W2 and a depth of the second hole 9 may be increased. Even though the first hole 5 is formed to have a limitation size (e.g., the minimum width) of the photolithography process, the first pattern 11a may be formed to have the diameter less than the width W1 of the first hole 5. A sum of the width of the first pattern 11a and a distance between two first patterns 11a adjacent to each other may be in the range of about 20 nm to about 50 nm.

Figure 8A:
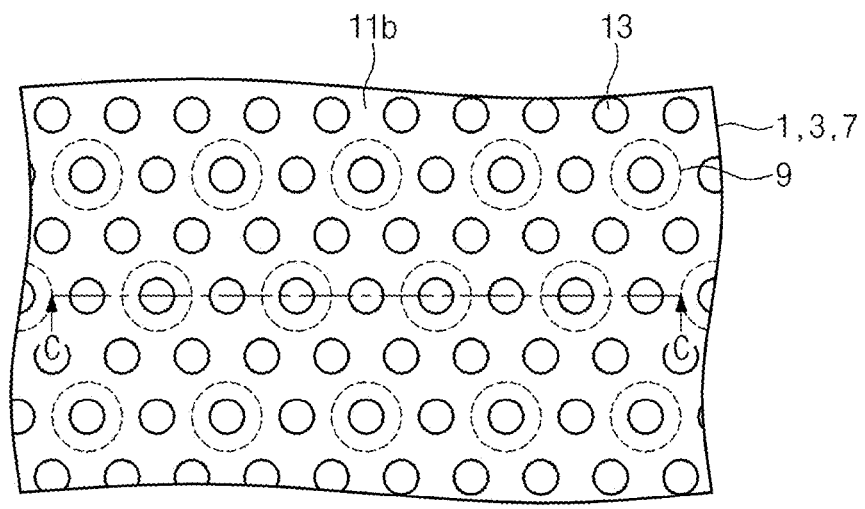
Figure 8B:
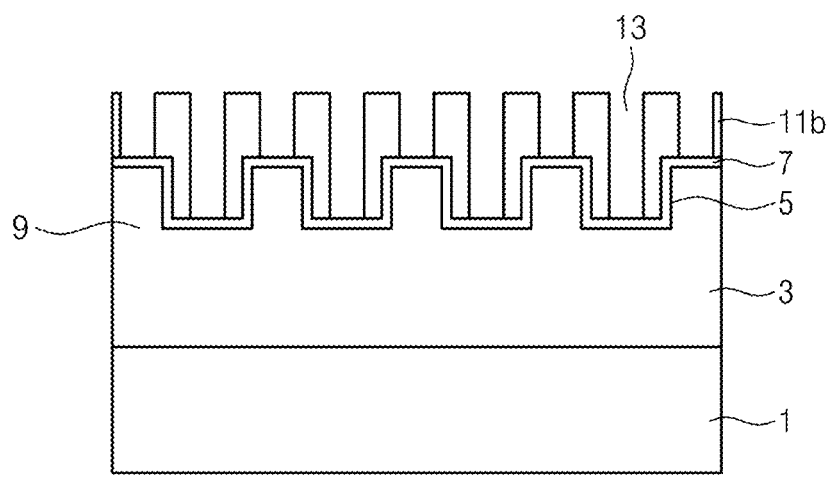

Referring to FIGS. 8A and 8B, the first patterns 11a are selectively removed. At this time, deep ultraviolet (DUV) rays may be irradiated to the first patterns 11a. The deep ultraviolet rays may have a wavelength ranging from 190 to 250 nm. A wet etching process may be performed after the irradiation using an etchant such as isopropyl alcohol (IPA). Alternatively, a dry etching process may be performed using a fluorine-based gas, argon, or oxygen to selectively remove the first patterns 11a. Thus, a plurality of third holes 13 may be formed to expose the top surface of the neutral layer 7. At this time, the second pattern 11b remains.

Figure 9A:
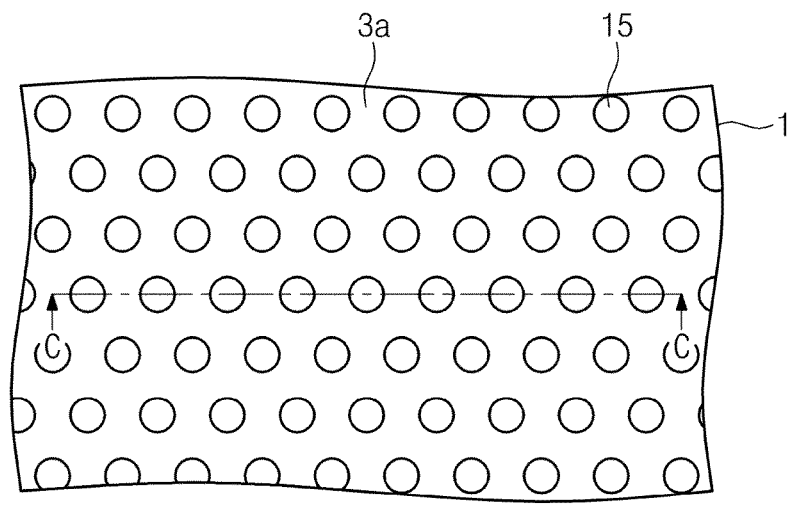
Figure 9B:
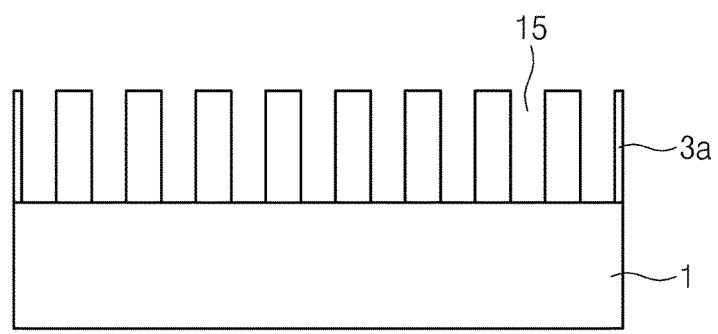

Referring to FIGS. 9A and 9B, the lower structure 3 is etched using the second pattern 11b as an etch mask, thereby forming a lower pattern 3a including fourth holes 15 to which the third holes 13 are transferred.

As described above, the block copolymer layer 11 is formed on the neutral layer 7 and then the phase separation is induced in the method of forming the pattern according to some non-limiting embodiments of the inventive concepts. The neutral layer 7 has the affinity for all of the hydrophilic polymer and the hydrophobic polymer. Thus, vertical cultivation of the first and second patterns 11a and 11b may be realized to induce the self-assembled phenomenon. As a result, the first and second patterns 11a and 11b may be formed at desired positions. Additionally, the molecular weight of the block copolymer may be controlled to form the patterns having sizes smaller than the limitation size of the photolithography process.

Figure 10:
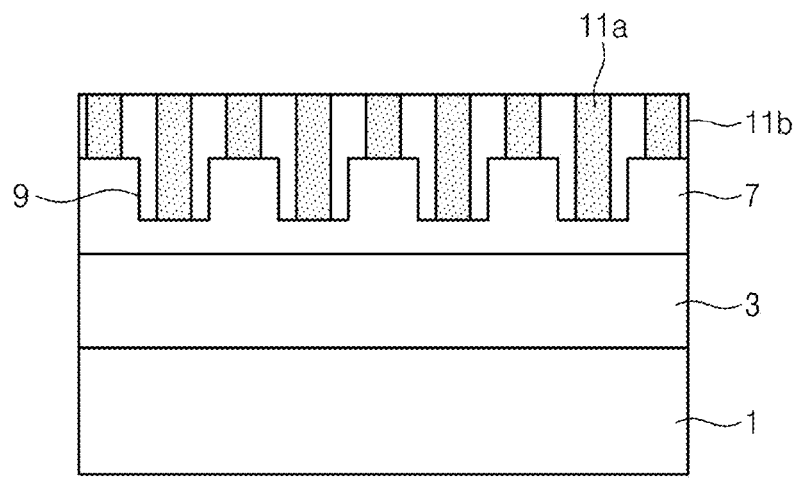
FIGS. 10 to 12 are cross-sectional views illustrating methods of forming a pattern according to other non-limiting embodiments of the inventive concepts.
Figure 11:
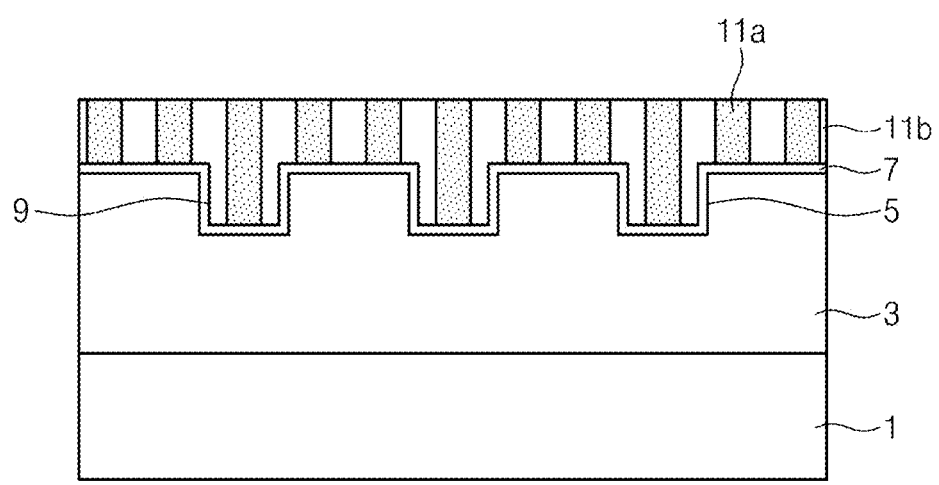
Figure 12:
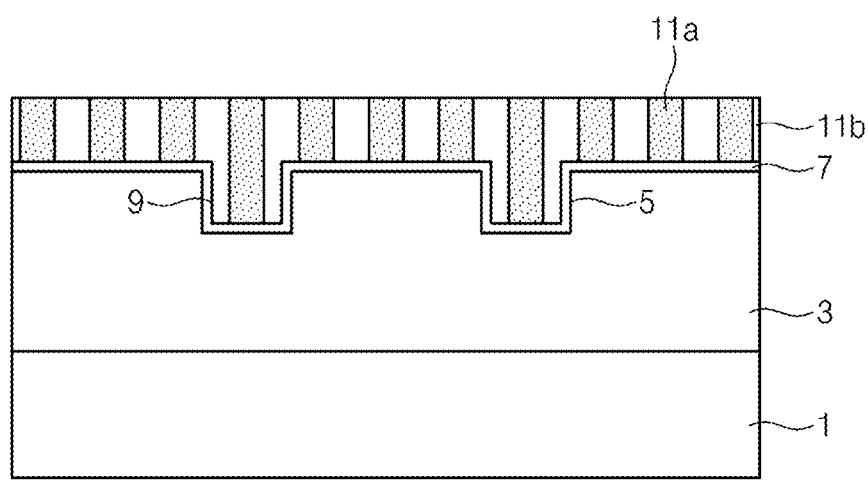

FIGS. 10 to 12 are cross-sectional views illustrating methods of forming a pattern according to other non-limiting embodiments of the inventive concepts.

Referring to FIG. 10, a top surface of a lower structure 3 may be flat and a plurality of second holes 9 may be formed in an upper portion of a neutral layer 7 in the present embodiment, although example embodiments are not limited thereto. At this time, the neutral layer 7 may be formed by a coating/deposition process and an etching process. Other processes of the present embodiment may be the same as/similar to corresponding processes described above.

Referring to FIG. 11, in the present embodiment, two first patterns 11a may be formed on the neutral layer 7 between two adjacent second holes 9, although example embodiments are not limited thereto. In this case, a distance between the second holes 9 may be greater than the distance between the second holes 9 described with reference to FIGS. 4b to 9b.

Referring to FIG. 12, in the present embodiment, three first patterns 11a may be formed on the neutral layer 7 between two adjacent second holes 9, although example embodiments are not limited thereto. In this case, a distance between the second holes 9 may be greater than the distance between the second holes 9 described with reference to FIG. 11.

If the distance between the second holes 9 is further increased, four or more first patterns 11a may be formed on the neutral layer 7 between two second holes 9 that are adjacent to each other.

Figure 13A:
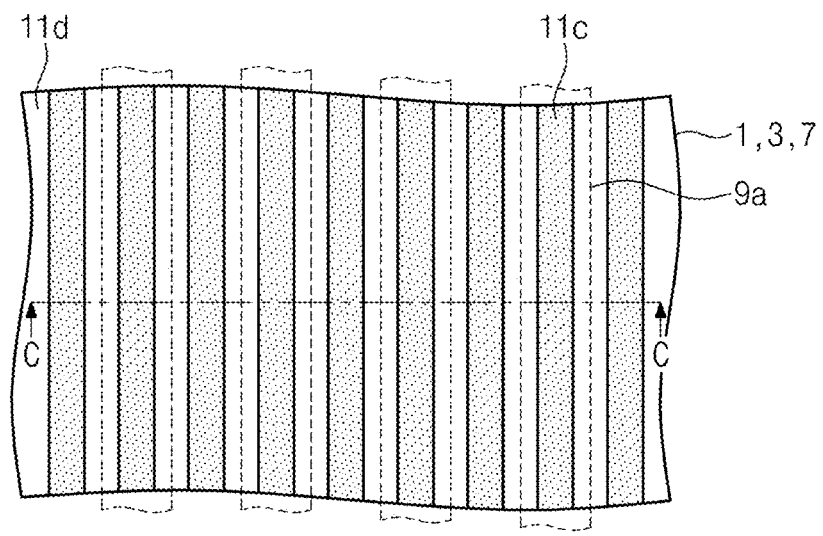
FIG. 13A is a plan view illustrating a method of forming a pattern according to other non-limiting embodiments of the inventive concepts.
Figure 13B:
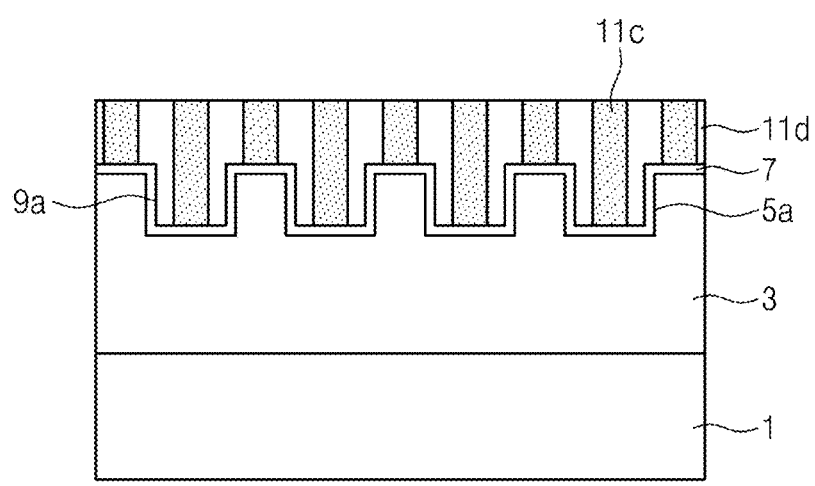
FIG. 13B is a cross-sectional view taken along a line C-C of FIG. 13A.

FIG. 13A is a plan view illustrating a method of forming a pattern according to other non-limiting embodiments of the inventive concepts. FIG. 13B is a cross-sectional view taken along a line C-C of FIG. 13A.

Referring to FIGS. 13A and 13B, first and second patterns 11c and 11d may be formed in lamellar form in a method according to the present embodiment, although example embodiments are not limited thereto. For instance, first grooves 5a having line-shapes may be formed in an upper portion of a lower structure 3, and then a neutral layer 7 may conformally cover the lower structure 3 to form second grooves 9a overlapping with the first grooves 5a on a top surface of the neutral layer 7. A volume ratio of a hydrophilic polymer and a hydrophobic polymer added for manufacturing a block copolymer may be about 50:50. First patterns 11c and second patterns 11d formed in this case may have line-shapes. A single first pattern 11c is formed in a single second groove 9a. A sum of a width of the first pattern 11c and a distance between two first patterns 11c that are adjacent to each other may be in the range of about 20 nm to about 50 nm. Alternatively, the first patterns 11c may have a cylindrical shape, as shown in FIG. 3.

Other elements of the present embodiment may be the same as/similar to corresponding elements described with reference to FIGS. 4A to 9A and 4B to 9B.

First Experimental Example

Figure 14A:
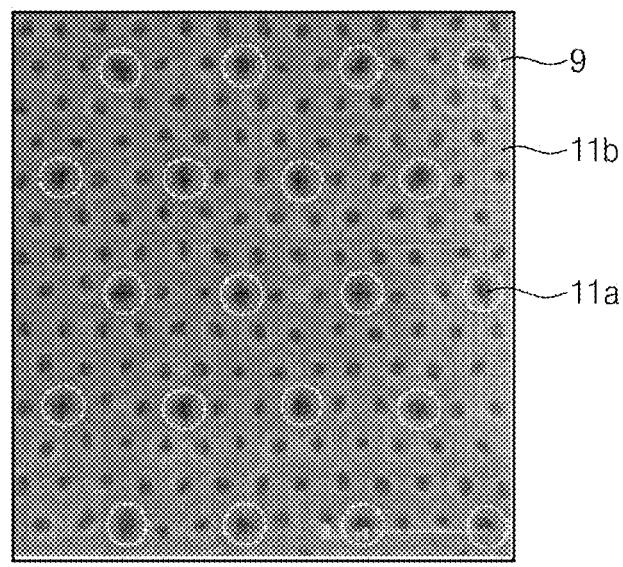
FIGS. 14A and 14B are planar scanning electron microscope (SEM) photographs of patterns formed by experimental examples of the inventive concepts.

A lower structure including a plurality of first holes 5 was formed on a semiconductor substrate and then a neutral layer was conformally coated on the lower structure to form second holes 9 on the neutral layer. A polymer brush including polystyrene (PS) and polymethylmethacrylate (PMMA) randomly copolymerized with each other was used as the neutral layer. Polystyrene-block-polymethylmethacrylate (PS-b-PMMA) as a diblock copolymer was used to form a block copolymer layer. In the present first experimental example, the polystyrene (PS) with a volumetric ratio of about 70% and the polymethylmethacrylate (PMMA) with a volumetric ratio of about 30% were added to form the block copolymer. The phase separation was performed to form first patterns 11a of PMMA and a second pattern 11b of PS. A scanning electron microscope (SEM) photograph of the first and second patterns 11a and 11b according to the present first experimental example was illustrated in FIG. 14A. As illustrated in FIG. 14A, one first pattern 11a was formed in one second hole 9, and distances between the first patterns 11a were substantially equal to each other.

Second Experimental Example

Figure 14B:
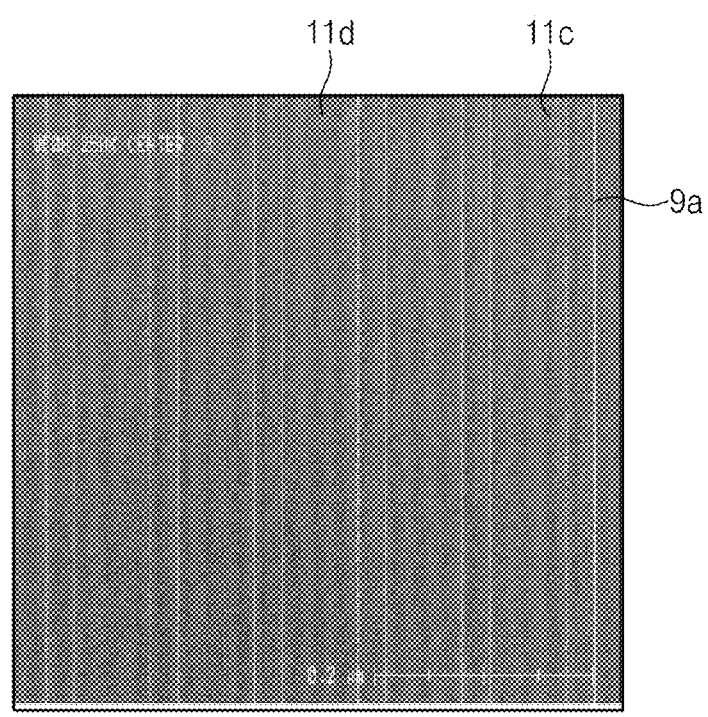

A lower structure including a plurality of first grooves 5a having line-shapes was formed on a semiconductor substrate and then a neutral layer was conformally coated on the lower structure to form second grooves 9a on the neutral layer. A polymer brush including polystyrene (PS) and polymethylmethacrylate (PMMA) randomly copolymerized with each other was used as the neutral layer. Polystyrene-block-polymethylmethacrylate (PS-b-PMMA) as a diblock copolymer was used to form a block copolymer layer. In the present second experimental example, the polystyrene (PS) with a volumetric ratio of about 50% and the polymethylmethacrylate (PMMA) with a volumetric ratio of about 50% were added to form the block copolymer. The phase separation was performed to form first patterns 11c of PMMA and second patterns 11d of PS. A scanning electron microscope (SEM) photograph of the first and second patterns 11c and 11d according to the present second experimental example was illustrated in FIG. 14B. As illustrated in FIG. 14B, one first pattern 11c was formed in one second groove 9a, and distances between the first patterns 11c were substantially equal to each other.

The method of forming the pattern according to non-limiting embodiments of the inventive concepts may be applied to a manufacturing process of a vertical semiconductor memory device.

Figure 15:
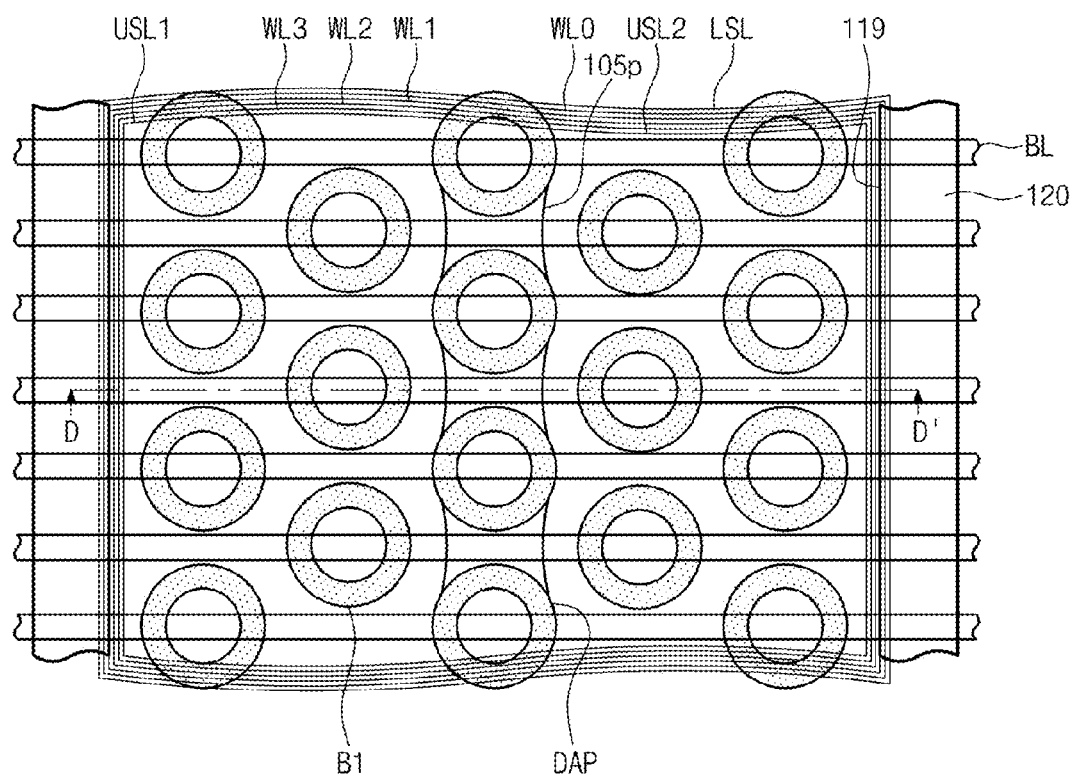
FIG. 15 is a plan view illustrating a semiconductor device according to some non-limiting application embodiments of the inventive concepts.
Figure 16:
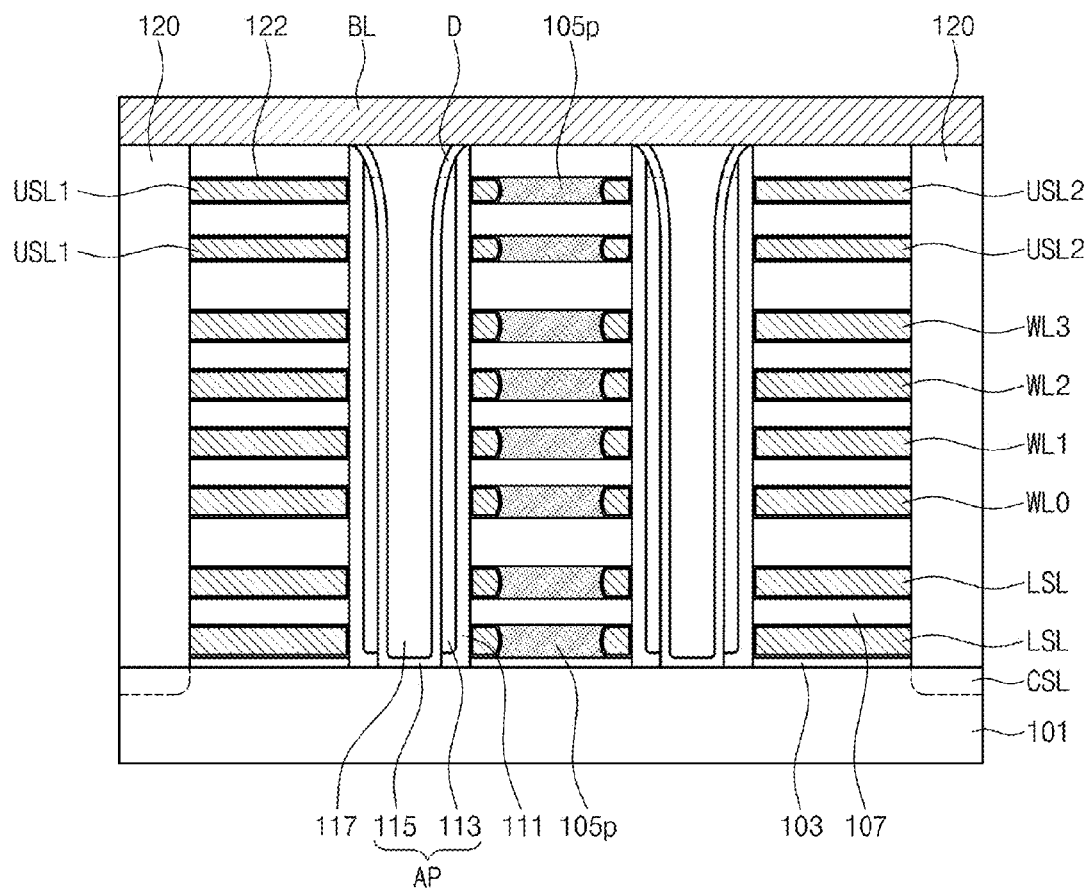
FIG. 16 is a cross-sectional view taken along a line D-D' of FIG. 15.

FIG. 15 is a plan view illustrating a semiconductor device according to some non-limiting application embodiments of the inventive concepts. FIG. 16 is a cross-sectional view taken along a line D-D' of FIG. 15.

Referring to FIGS. 15 and 16, the vertical semiconductor memory device may include a common source line CSL disposed in a substrate 101, and a lower selection line LSL, word lines WL0 to WL3, upper selection lines USL1 and USL2 and bit lines BL disposed on the substrate 101. Active patterns AP may vertically extend from the substrate 101 and may be connected to the bit lines BL. The active patterns AP may be formed to penetrate the upper selection lines USL1 and USL2, the word lines WL0 to WL3, and the lower selection lines LSL.

A gate insulating layer 111 may be disposed between the active pattern AP and the lines LSL, WL, USL1, and USL2. According to the present embodiment, the gate insulating layer 111 may include at least one of a tunnel insulating layer, a charge trap layer, and a blocking insulating layer. The charge trap layer may not exist between the active pattern AP and the lower selection line LSL and/or between the active pattern AP and the upper selection lines USL1 and USL2. A high-k dielectric layer 122 may be disposed between the gate insulating layer 111 and the lines LSL, WL, USL1, and USL2. A common drain region D may be disposed in a top end portion of the active pattern AP. In other non-limiting embodiments, the high-k dielectric layer 122 may include a blocking layer.

The active pattern AP includes a first active layer 113 and a second active layer 115. The active layers 113 and 115 may be undoped poly-silicon layers or semiconductor layers. The first active layer 113 may have a spacer-shape. The second active layer 115 is in contact with both the first active layer 113 and the substrate 101. The active pattern AP may have a cup-shape. An inner region of the active pattern AP is filled with a first filling insulation pattern 117.

Two upper selection lines USL may be stacked on the word lines WL. Two lower selection lines LSL may be stacked on the substrate 101, and the word lines WL may be stacked on the two lower selection lines LSL.

A buffer oxide layer 103 may be disposed on the substrate 101. Gate interlayer insulating layers 107 may be disposed on a top surface of the upper selection line USL, between the upper selection line USL and the word line WL3, between the word lines WL0 to WL3, and between the word line WL0 and the lower selection line LSL. A second filling insulation pattern 120 may be disposed between the upper selection lines USL1 and USL2 to separate the upper selection lines USL1 and USL2 from each other. The second filling insulation pattern 120 may extend to be disposed between the word lines WL0 to WL3 and between the lower selection lines LSL.

A sacrificial pattern 105p spaced apart from the second filling insulation pattern 120 is disposed between at least the upper selection lines USL of the lines USL, LSL, and WL. The sacrificial pattern 105p may be formed of a material having an etch rate different from an etch rate of the gate interlayer insulating layer 107. A dummy active pattern DAP contacting the sacrificial pattern 105p may be disposed between the upper selection lines USL. The dummy active pattern DAP may have the same shape as the active pattern AP. However, the dummy active pattern DAP does not act as the active pattern AP. The dummy active pattern DAP may relax a stress between adjacent structures.

The methods of forming hole-patterns described with reference to FIGS. 4A to 9A, 4B to 9B, and 10 to 12 according to the inventive concepts may be applied to a method of forming holes in which the active pattern AP and the dummy active pattern DAP are disposed.

The method of forming line-patterns described with reference to FIGS. 13A and 13B according to the inventive concepts may be applied to a method of forming the bit lines BL.

The methods of forming the pattern according to the inventive concepts may be applied to a method of manufacturing a dynamic random access memory (DRAM) device.

Figure 17A:
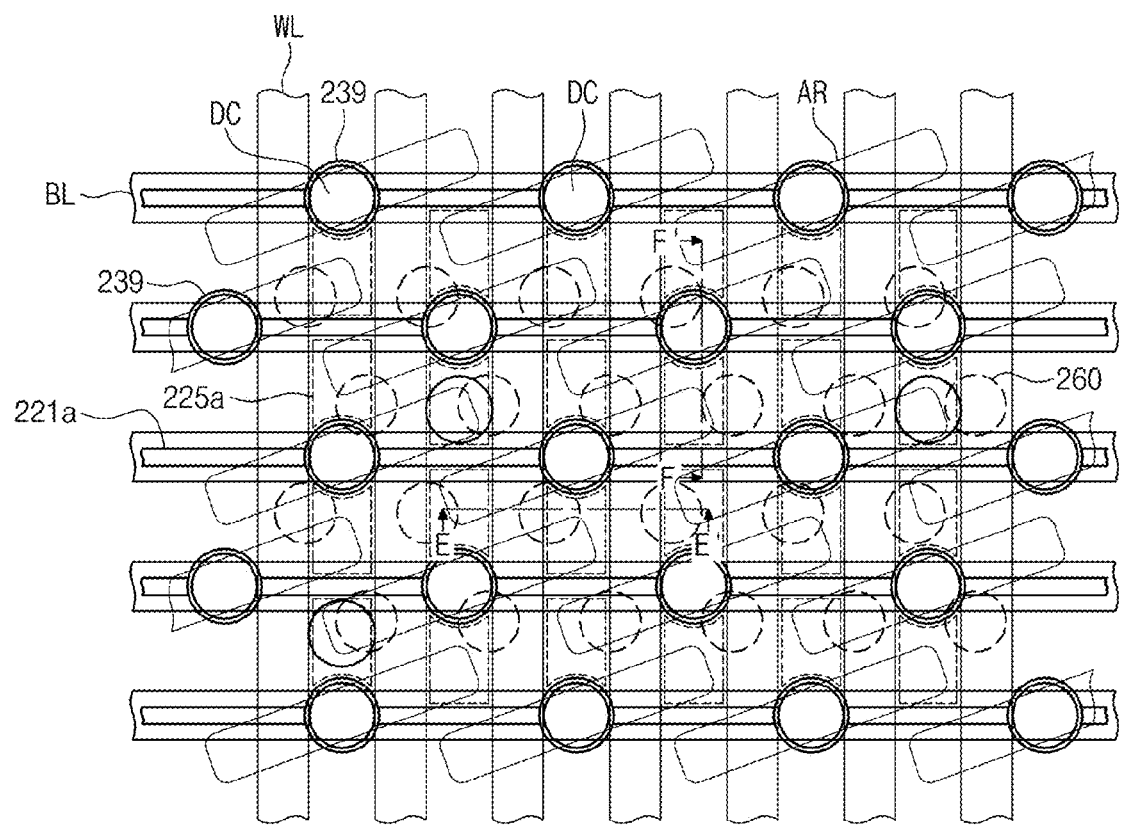
FIG. 17A is a plan view illustrating a dynamic random access memory (DRAM) device according to other non-limiting application embodiments of the inventive concepts.
Figure 17B:
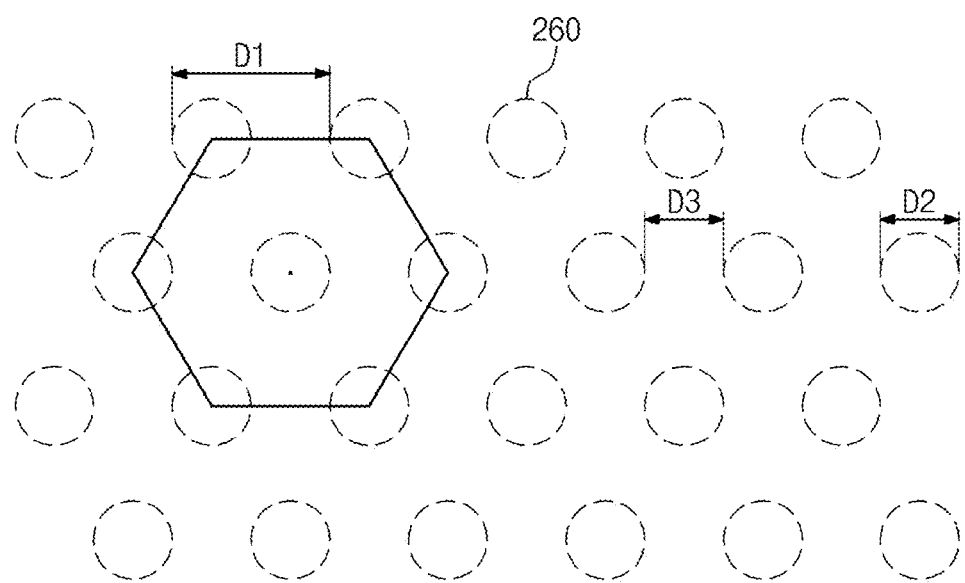
FIG. 17B is a plan view illustrating an arrangement of the lower electrodes of FIG. 17A.
Figure 18A:
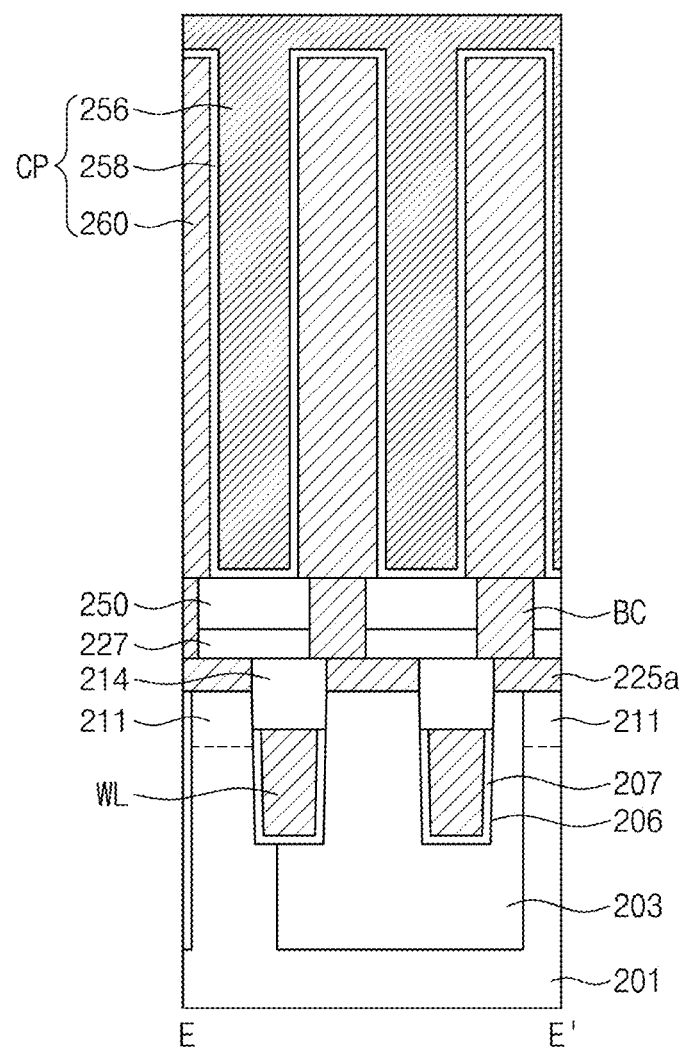
FIGS. 18A and 18B are cross-sectional views taken along lines E-E' and F-F' of FIG. 17A, respectively.
Figure 18B:
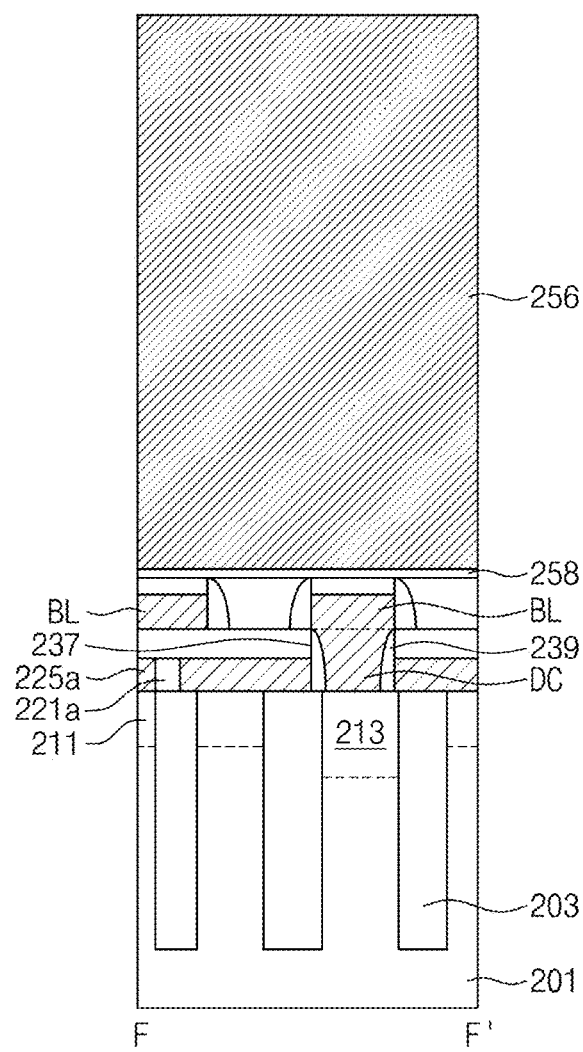

FIG. 17A is a plan view illustrating a DRAM device according to other non-limiting application embodiments of the inventive concepts. FIG. 17B is a plan view illustrating an arrangement of the lower electrodes of FIG. 17A. FIGS. 18A and 18B are cross-sectional views taken along lines E-E' and F-F' of FIG. 17A, respectively.

Referring to FIGS. 17A, 17B, 18A, and 18B, in the DRAM device, a device isolation layer 203 is disposed on or in a substrate 201 to define active regions AR. A plurality of word lines WL may be disposed in the substrate 201 to cross the active regions AR and the device isolation layer 203. The word lines WL are disposed in grooves 206. Top surfaces of the word lines WL may be disposed to be lower than a top surface of the substrate 201. A gate insulating layer 207 is disposed between the substrate 201 and the word lines WL. A first dopant injection region 211 is disposed in each active region AR at one side of the word line WL, and a second dopant injection region 213 is disposed in each active region AR at another side of the word line WL.

First capping patterns 214 may be disposed on the word lines WL, respectively. Storage node pads 225a respectively contacting the first dopant injection regions 211 are disposed between the first capping patterns 214 adjacent to each other. Additionally, a separation pattern 221a contacting the device isolation layer 203 is disposed between the first capping patterns 214 adjacent to each other and between the storage node pads 225a adjacent to each other.

A first insulating layer 227 may be disposed on the substrate 201. Bit lines may be disposed on the first insulating layer 227. The bit line BL is electrically connected to the second dopant injection region 213 through a bit line node contact DC contacting the second dopant injection region 213. The bit line node contact DC is disposed in a bit line node hole 237 formed by etching the first insulating layer 227, a portion of the first capping pattern 214, and a portion of the substrate 201.

A sidewall of the bit line node hole 237 is covered by an insulating spacer 239. A second insulating layer 250 may be disposed on the first insulating layer 227. A storage node contact BC penetrates the second and first insulating layers 250 and 227 to be in contact with each of the storage node pads 225a. A lower electrode 260 is disposed on the second insulating layer 250. The storage node contact BC is in contact with the lower electrode 260. A top surface and sidewalls of the lower electrode 260 is conformally covered by a dielectric layer 258. The dielectric layer 258 may include a metal oxide having a high dielectric constant. The dielectric layer 258 may be conformally covered by an upper electrode layer 256. The lower electrode 260, the dielectric layer 258, and the upper electrode layer 256 may constitute a capacitor CP.

Referring to FIG. 17B, the lower electrodes 260 may be arranged to be disposed at vertices and a center of a hexagon. In other words, one lower electrode 260 may be disposed at the center of the hexagon, and six lower electrodes 260 may be respectively disposed at the vertices of the hexagon to surround the one lower electrode. At this time, a length D1 corresponding to a sum of a diameter D2 of the lower electrode 260 and a distance D3 between two adjacent lower electrodes 260 may be in the range of about 30 nm to about 50 nm.

In the methods of forming the pattern according to the inventive concepts, the methods of forming the hole-patterns described with reference to FIGS. 4A to 9A, 4B to 9B, and 10 to 12 may be applied to a process of forming holes for the storage node contacts BC, a process of forming the bit line node holes 237, and a process of forming holes for the formation of the lower electrodes 260. Thus, patterns having narrow diameters and narrow spaces may be formed.

In the methods of forming the pattern according to the inventive concepts, the method of forming the line-patterns described with reference to FIGS. 13A and 13B may be applied to a process of forming the grooves 206 for the formation of the word lines WL, and a process of forming the bit lines BL. Since the methods of forming the pattern according to the inventive concepts are applied, patterns having narrow line and space may be formed.

The methods of forming the pattern according to the inventive concepts may be applied to a process of manufacturing a Fin field effect transistor (Fin-FET) device.

Figure 19:
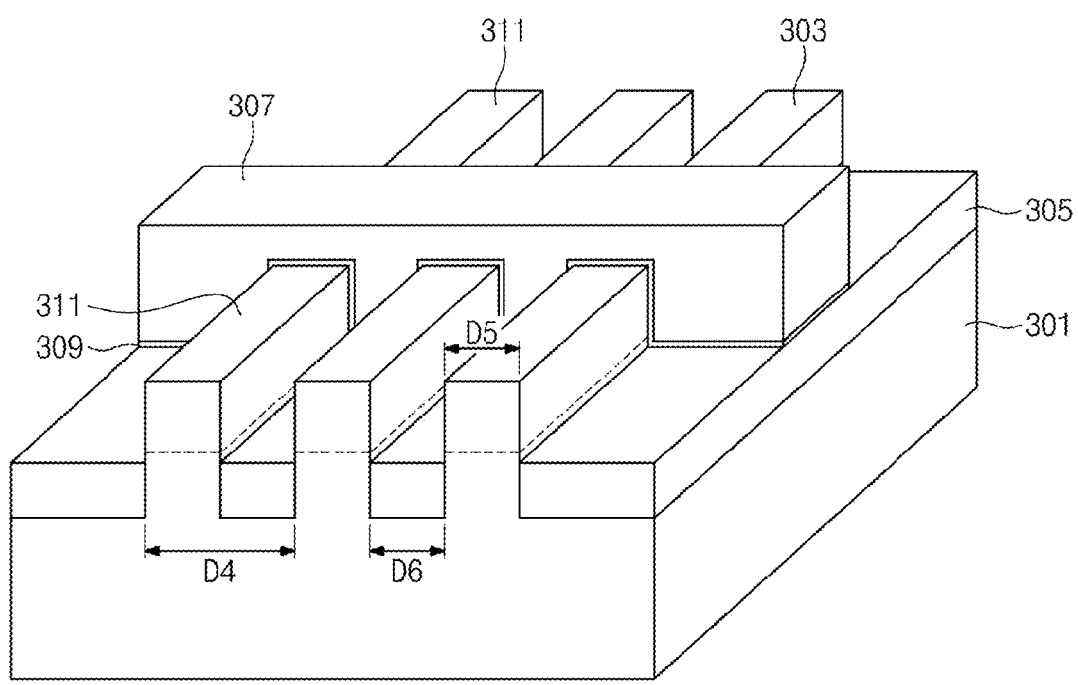
FIG. 19 is a perspective view illustrating a fin field effect transistor (Fin-FET) device according to other non-limiting application embodiments of the inventive concepts.

FIG. 19 is a perspective view illustrating a fin field effect transistor (Fin-FET) device according to other non-limiting application embodiments of the inventive concepts.

Referring to FIG. 19, a plurality of active fins 303 having line-shapes may protrude from a substrate 301. A device isolation layer 305 that is lower than top surfaces of the active fins 303 is disposed at both sides of each of the active fins 303. A gate electrode 307 crosses over the active fins 303. A gate insulating layer 309 is disposed between the gate electrode 307 and the active fins 303. Source/drain regions 311 are disposed in the active fins 303 at both sides of the gate electrode 307.

In the methods of forming the pattern according to the inventive concepts, the methods of forming the line-patterns described with reference to FIGS. 13A and 13B may be applied to a process of forming the active fins 303. At this time, a length D4 corresponding to a sum of a width D5 of the active fin 303 and a distance D6 between two adjacent active fins 303 may be in the range of about 20 nm to about 40 nm. Since the methods of forming the pattern according to the inventive concepts are applied, patterns having narrow line and space may be formed.

According to some non-limiting embodiments of the inventive concepts, the block copolymer layer is formed on the neutral layer having the uneven structure and then the phase separation is induced. The neutral layer has the affinity for all of the hydrophilic polymer and the hydrophobic polymer, so that the vertical cultivation of phases of the block copolymer may be well realized on the uneven structure. Thus, the self-assembled phenomenon may be well induced. As a result, the patterns may be formed at desired positions. Additionally, the molecular weight of the block copolymer may be controlled to form the pattern having the size smaller than the limitation size of the photolithography process. Furthermore, the pattern having the smaller size than the limitation size is formed without a relatively expensive EUV apparatus, so that process costs may be reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of forming a pattern, the method comprising:
   forming a neutral layer having an uneven structure over a substrate such that lower surfaces of the neutral layer have different distances to the substrate;
   coating a block copolymer layer on the neutral layer;
   phase-separating the block copolymer layer to form a plurality of first patterns spaced apart from each other and a second pattern filling a space between the first patterns;
   removing the first patterns or the second pattern; and
   performing an etching process using a not-removed pattern of the first patterns or the second pattern as an etch mask.

2. The method of claim 1, wherein forming the neutral layer comprises:
   forming a lower structure having an uneven surface on the substrate; and
   conformally forming the neutral layer to cover the uneven surface of the lower structure.

3. The method of claim 2, wherein the neutral layer is conformally formed by a coating process.

4. The method of claim 1, wherein the first patterns and the second pattern have different properties from each other.

5. The method of claim 4, wherein the first patterns have a hydrophilic property, and the second pattern has a hydrophobic property.

6. The method of claim 5, wherein the first patterns are removed, the removing the first patterns including
   irradiating the first patterns with deep ultraviolet rays; and
   performing a wet etching process to remove the first patterns.

7. The method of claim 5, wherein the first patterns are removed, the removing the first patterns including performing a dry etching process to remove the first patterns.

8. The method of claim 1, wherein the uneven structure includes a plurality of holes.

9. The method of claim 8, wherein a single first pattern is formed in each of the holes.

10. The method of claim 8, wherein the first patterns are formed to have cylinder-shapes.

11. The method of claim 1, wherein the uneven structure includes a plurality of grooves having line-shapes.

12. The method of claim 11, wherein a single first pattern is formed in each of the grooves.

13. The method of claim 11, wherein the first patterns are formed to have line-shapes.

14. The method of claim 1, wherein the neutral layer includes a polymer brush or a random copolymer.

15. The method of claim 1, wherein forming the neutral layer having the uneven structure comprises:
   forming a neutral film having a flat top surface on the substrate; and
   removing a portion of the neutral film by an etching process, thereby forming the neutral layer having the uneven structure in an upper portion of the neutral layer.

16. The method of claim 1, wherein a sum of a width of one of the first patterns and a distance between two adjacent first patterns is in the range of about 20 nm to about 50 nm.

17. The method of claim 1, wherein the block copolymer layer includes at least one selected from a group consisting of polystyrene-block-polymethylmethacrylate (PS-b-PMMA), polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene.

18. A method of forming a pattern, the method comprising:
forming a lower structure having an uneven structure on a substrate;
conformally forming a neutral layer covering a surface of the lower structure;
coating a block copolymer layer on the neutral layer;
phase-separating the block copolymer layer to form first patterns spaced apart from each other and a second pattern filling a space between the first patterns;
removing the first patterns or the second pattern; and
performing an etching process with respect to the lower structure using a not-removed pattern of the first patterns or the second pattern as an etch mask.

19. A method of forming a pattern, comprising:
coating a neutral layer with a block copolymer layer, the neutral layer having an uneven and continuous profile;
phase-separating the block copolymer layer to form a plurality of first patterns within a second pattern;
removing the plurality of first patterns or the second pattern to obtain a remaining pattern; and
performing an etching process using the remaining pattern as an etch mask.

20. The method of claim 19, wherein the plurality of first patterns is hydrophilic, and the second pattern is hydrophobic.

21. The method of claim 19, wherein the plurality of first patterns is cylindrically shaped, the plurality of first patterns extending from the neutral layer and through the second pattern.

22. The method of claim 19, wherein the plurality of first patterns is linearly shaped, the plurality of first patterns extending in parallel across the neutral layer.

23. The method of claim 19, wherein a sum of a width of one of the plurality of first patterns and a distance to an adjacent first pattern is in the range of about 20 to 50 nm.

24. The method of claim 19, wherein the neutral layer includes a top surface and an opposing bottom surface, the top surface including the uneven profile, the bottom surface conforming to the uneven profile of the top surface.

25. The method of claim 19, wherein the neutral layer includes a top surface and an opposing bottom surface, the top surface including the uneven profile, the bottom surface including a planar surface.

26. The method of claim 19, wherein the uneven profile includes a ridge portion and a furrow portion.

27. The method of claim 26, wherein adjacent first patterns of the plurality of first patterns are alternately arranged on the ridge portion and the furrow portion of the uneven profile.

28. The method of claim 26, wherein adjacent first patterns of the plurality of first patterns are arranged on the ridge portion.

* * * * *